(12) United States Patent
Park et al.

(10) Patent No.: US 9,912,258 B2
(45) Date of Patent: Mar. 6, 2018

(54) ELECTROSTATIC CHUCK ASSEMBLIES CAPABLE OF BIDIRECTIONAL FLOW OF COOLANT AND SEMICONDUCTOR FABRICATING APPARATUS HAVING THE SAME

(71) Applicant: SAMSUNG ELECTRONICS CO., LTD., Suwon-si, Gyeonggi-do (KR)

(72) Inventors: Haejoong Park, Suwon-si (KR); Hongmyoung Kim, Pyeongtaek-si (KR); Kye Hyun Baek, Suwon-si (KR); Sangkyu Park, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 154 days.

(21) Appl. No.: 14/842,936

(22) Filed: Sep. 2, 2015

(65) Prior Publication Data

US 2016/0071755 A1 Mar. 10, 2016

(30) Foreign Application Priority Data

Sep. 4, 2014 (KR) .................. 10-2014-0117784

(51) Int. Cl.
*H01T 23/00* (2006.01)
*H02N 13/00* (2006.01)
*H01L 21/67* (2006.01)
*H01L 21/683* (2006.01)

(52) U.S. Cl.
CPC ....... *H02N 13/00* (2013.01); *H01L 21/67109* (2013.01); *H01L 21/6831* (2013.01)

(58) Field of Classification Search
USPC .................................. 361/230, 234
See application file for complete search history.

(56) References Cited

U.S. PATENT DOCUMENTS

| | | | |
|---|---|---|---|
| 7,988,872 | B2 | 8/2011 | Brillhart et al. |
| 8,092,638 | B2 | 1/2012 | Brillhart et al. |
| 8,092,639 | B2 | 1/2012 | Buchberger, Jr. et al. |
| 8,157,951 | B2 | 4/2012 | Buchberger, Jr. et al. |
| 8,337,660 | B2 | 12/2012 | Buchberger, Jr. et al. |

(Continued)

FOREIGN PATENT DOCUMENTS

| | | |
|---|---|---|
| JP | 2014-011382 A | 1/2014 |
| KR | 10-2007-0007494 A | 1/2007 |

(Continued)

*Primary Examiner* — Danny Nguyen
(74) *Attorney, Agent, or Firm* — Lee & Morse, P.C.

(57) ABSTRACT

An electrostatic chuck assembly, including an electrostatic chuck on which a substrate is loaded; a channel that provides a flow passage for coolant in the electrostatic chuck, the channel having a first opening at a first end corresponding to a center of the substrate and a second opening at a second end corresponding to an edge of the substrate; and a valve box to control a flow direction of the coolant in the channel, the valve box including a first supply valve to control an introduction of the coolant into the first opening; a first return valve to control a drainage of the coolant from the second opening; a second supply valve to control an introduction of the coolant into the second opening; and a second return valve to control a drainage of the coolant from the first opening.

20 Claims, 15 Drawing Sheets

(56) References Cited

U.S. PATENT DOCUMENTS

| | | | |
|---|---|---|---|
| 2006/0219360 A1* | 10/2006 | Iwasaki | G05D 23/1902 156/345.27 |
| 2007/0158025 A1 | 7/2007 | Larson | |
| 2008/0017107 A1 | 1/2008 | Arai et al. | |
| 2010/0116788 A1 | 5/2010 | Singh et al. | |
| 2012/0091104 A1 | 4/2012 | Tavassoli et al. | |
| 2014/0008020 A1 | 1/2014 | Nagayama | |

FOREIGN PATENT DOCUMENTS

| | | |
|---|---|---|
| KR | 10-2012-0043574 A | 5/2012 |
| KR | 10-2012-0086093 A | 8/2012 |

* cited by examiner

ELECTROSTATIC CHUCK ASSEMBLIES CAPABLE OF BIDIRECTIONAL FLOW OF COOLANT AND SEMICONDUCTOR FABRICATING APPARATUS HAVING THE SAME

CROSS-REFERENCE TO RELATED APPLICATION

Korean Patent Application 10-2014-0117784, filed on Sep. 4, 2014, in the Korean Intellectual Property Office, and entitled: "Electrostatic Chuck Assemblies Capable of Bidirectional Flow of Coolant and Semiconductor Fabricating Apparatus Having the Same," is incorporated by reference herein in its entirety.

BACKGROUND

1. Field

Provided is a wafer chuck.

2. Description of the Related Art

In manufacturing of semiconductor devices, various types of chucks, e.g., mechanical clamps or vacuum chucks, may be used to hold wafers. Electrostatic chucks may provide uniform heat treatment without producing particles by using an electrostatic force. Enhancing the temperature distribution of a wafer may help improve process uniformity.

SUMMARY

Embodiments may be realized by providing an electrostatic chuck assembly, including an electrostatic chuck on which a substrate is loaded; a channel that provides a flow passage for coolant in the electrostatic chuck, the channel having a first opening at a first end corresponding to a center of the substrate and a second opening at a second end corresponding to an edge of the substrate; and a valve box to control a flow direction of the coolant in the channel, the valve box including a first supply valve to control an introduction of the coolant into the first opening; a first return valve to control a drainage of the coolant from the second opening; a second supply valve to control an introduction of the coolant into the second opening; and a second return valve to control a drainage of the coolant from the first opening.

When each of the first supply and return valves is set to be in an open state and each of the second supply and return valves is set to be in a closed state, the open state of the first supply valve may allow the coolant to flow into the channel through the first opening, and the open state of the first return valve may allow the coolant to discharge from the channel through the second opening.

The coolant may flow in a direction toward the edge of the substrate from the center of the substrate.

When each of the first supply and return valves is set to be in a closed state and each of the second supply and return valves is set to be in an open state, the open state of the second supply valve may allow the coolant to flow into the channel through the second opening, and the open state of the second return valve may allow the coolant to discharge from the channel through the first opening.

The coolant may flow in a direction toward the center of the substrate from the edge of the substrate.

The channel may spirally extend around the center of the substrate toward the edge of the substrate.

The electrostatic chuck assembly may further include a chiller to transfer the coolant to the valve box.

The electrostatic chuck assembly may further include a controller to control operations of the valve box and the chiller, the controller being electrically connected to the valve box and the chiller.

The electrostatic chuck assembly may further include a supply line to provide the coolant with a supply passage to the valve box from the chiller; and a return line to provide the coolant with a return passage to the chiller from the valve box.

The supply line may include an end connected to the chiller and a branched-out end connected to the first supply valve and the second supply valve, and the return line may include an end connected to the chiller and a branched-out end connected to the first return valve and the second return valve.

The electrostatic chuck assembly may further include a forward line to provide the coolant with a forward directional passage to the first opening from the valve box; and a backward line to provide the coolant with a backward directional passage to the second opening from the valve box. The forward line may include an end connected to the first opening and a branched-out end connected to the first supply valve and the second return valve. The backward line may include an end connected to the second opening and a branched-out end connected to the second supply valve and the first return valve.

When each of the first supply and return valves is set to be in an open state and each of the second supply and return valves is set to be in a closed state, the open state of the first supply valve may allow the coolant to flow into the channel through the forward line via the first opening, and the open state of the first return valve may allow the coolant to discharge from the channel through the backward line via the second opening.

When each of the first supply and return valves is set to be in a closed state and each of the second supply and return valves is set to be in an open state, the open state of the second supply valve may allow the coolant to flow into the channel through the backward line via the second opening, and the open state of the second return valve may allow the coolant to discharge from the channel through the forward line via the first opening.

The electrostatic chuck assembly may further include a second valve box to control the flow direction of the coolant in the channel, the second valve box including a third supply valve to control an introduction of the coolant into the first opening; a third return valve to control an drainage of the coolant from the second opening; a fourth supply valve to control an introduction of the coolant into the second opening; and a fourth return valve to control an drainage of the coolant from the first opening.

When each of the third supply and return valves is set to be in an open state and each of the fourth supply and return valves is set to be in a closed state, the open state of the third supply valve may allow the coolant to flow into the channel through the first opening, and the open state of the third return valve may allow the coolant to discharge from the channel through the second opening.

When each of the third supply and return valves is set to be in a closed state and each of the fourth supply and return valves is set to be in an open state, the open state of the fourth supply valve may allow the coolant to flow into the channel through the second opening, and the open state of the fourth return valve may allow the coolant to discharge from the channel through the first opening.

The electrostatic chuck assembly may further include a chiller to transfer the coolant to the valve box and the second valve box.

The electrostatic chuck assembly may further include a first chiller to transfer the coolant to the valve box; and a second chiller to transfer the coolant to the second valve box.

Embodiments may be realized by providing an electrostatic chuck assembly, including an electrostatic chuck on which a substrate is loaded; a channel that provides a flow passage for coolant in the electrostatic chuck, the channel having a first opening at a first end corresponding to a center of the substrate and a second opening at a second end corresponding to an edge of the substrate, the channel spirally extending around the first opening toward the second opening; and a valve box to control a flow direction of the coolant in the channel, the valve box including a first valve group to provide the coolant with a centrifugal flow toward the second opening from the first opening; and a second valve group to provide the coolant with a centripetal flow toward the first opening from the second opening, the centrifugal flow of the coolant being established by an open state of the first valve group and a closed state of the second valve group, and the centripetal flow of the coolant being established by a closed state of the first valve group and an open state of the second valve group.

The first valve group may include a first supply valve to allow and prohibit a flow of the coolant into the first opening; and a first return valve to allow and prohibit a flow of the coolant from the second opening, and the second valve group may include a second supply valve to allow and prohibit a flow of the coolant into the second opening; and a second return valve to allow and prohibit a flow of the coolant from the first opening.

The centrifugal flow and the centripetal flow may be switched therebetween based on a switching between the first supply valve and the second supply valve or a switching between the first return valve and the second return valve.

When each of the first supply and return valves is set to be in an open state and each of the second supply and return valves is set to be in a closed state, the coolant may have the centrifugal flow.

When each of the first supply and return valves is set to be in a closed state and each of the second supply and return valves is set to be in an open state, the coolant may have the centripetal flow.

The electrostatic chuck assembly may further include a plurality of lines each to provide the coolant with a flow passage between the valve box and the channel, the plurality of lines including a forward line to provide the coolant with a forward directional passage toward the first opening from the valve box, the forward line including an end connected to the first opening and a branched-out end connected to the first supply valve and the second return valve; and a backward line to provide the coolant with a backward directional passage toward the second opening from the valve box, the backward line including an end connected to the second opening and a branched-out end connected to the second supply valve and the first return valve.

The electrostatic chuck assembly may further include a chiller to transfer the coolant to the valve box; and a plurality of lines to provide the coolant with flow passages between the valve box and the chiller.

The plurality of lines may include a supply line to provide the coolant with a supply passage into the valve box from the chiller, the supply line including an end connected to the chiller and a branched-out end connected to the first supply valve and the second supply valve; and a return line to provide the coolant with a return passage into the chiller from the valve box, the return line including an end connected to the chiller and a branched-out end connected to the first return valve and the second return valve.

Embodiments may be realized by providing a semiconductor fabricating apparatus, including a showerhead electrode assembly to distribute a processing gas; an electrostatic chuck assembly on which a substrate is loaded; and a plasma confinement region between the showerhead electrode assembly and the electrostatic chuck assembly, the electrostatic chuck assembly including an electrostatic chuck including a channel embedded therein, the channel having a first opening at a first end corresponding to a center of the substrate and a second opening at a second end corresponding to an edge of the substrate; and a coolant circulating system including a valve box adapted to control a flow circulation of the coolant in the channel, and the valve box including a first supply valve to control an introduction of the coolant into the first opening; a first return valve to control a drainage of the coolant from the second opening; a second supply valve to control an introduction of the coolant into the second opening; and a second return valve to control a drainage of the coolant from the first opening.

When each of the first supply and return valves is set to be in an open state and each of the second supply and return valves is set to be in a closed state, the coolant may be introduced into the channel via the first opening by the open state of the first supply valve and may be drained from the channel via the second opening by the open state of the first return valve after passing through the channel, thereby establishing a forward directional circulation of the coolant in the channel.

When each of the first supply and return valves is set to be in a closed state and each of the second supply and return valves is set to be in an open state, the coolant may be introduced into the channel via the second opening by the open state of the second supply valve and may be drained from the channel via the first opening by the open state of the second return valve after passing through the channel, thereby establishing a backward directional circulation of the coolant in the channel.

The coolant circulating system may further include a chiller to transfer the coolant to the valve box; and a controller to control operations of the valve box and the chiller, the controller being electrically connected to the valve box and the chiller.

The coolant circulating system may further include a supply line to provide the coolant with a supply passage into the valve box from the chiller, the supply line including an end connected to the chiller and a branched-out end connected to the first supply valve and the second supply valve; a return line to provide the coolant with a return passage into the chiller form the valve box, the return line including an end connected to the chiller and a branched-out end connected to the first return valve and the second return valve; a forward line to provide the coolant with a forward directional passage into the first opening from the valve box, the forward line including an end connected to the first opening and a branched-out end connected to the first supply valve and the second return valve; and a backward line to provide the coolant with a backward directional passage into the second opening from the valve box, the backward line including an end connected to the second opening and a branched-out end connected to the second supply valve and the first return valve.

The showerhead electrode assembly may include an upper electrode to define the plasma confinement region together with the electrostatic chuck assembly; a showerhead to distribute the processing gas into the plasma confinement region; a heater plate on the showerhead, the heater plate including a heater electrode embedded therein; and a cooling plate on the heater plate, the cooling plate including a cooling channel embedded therein.

Embodiments may be realized by providing an electrostatic chuck assembly, including a base having a disk shape; a channel in the base, the channel to provide a flow passage for fluid in the electrostatic chuck; a dielectric layer on the base, the dielectric layer including an insulator and having a disk shape whose diameter is smaller than that of a portion of the base; an electrostatic electrode embedded in the dielectric layer, the electrostatic electrode to receive an electrical power; a focus ring surrounding the dielectric layer; and a controller to provide bidirectional flow of the fluid in the channel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
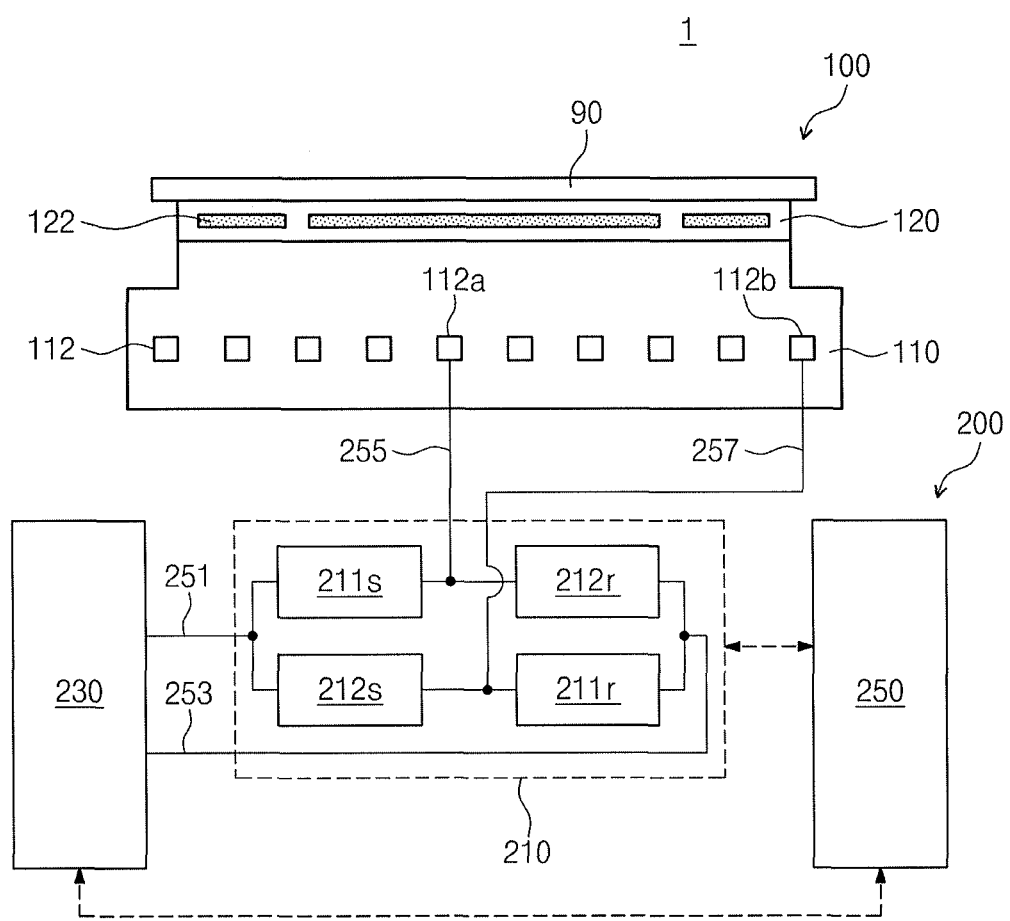
FIG. 1A illustrates a schematic view of an electrostatic chuck assembly according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Figure 1B:
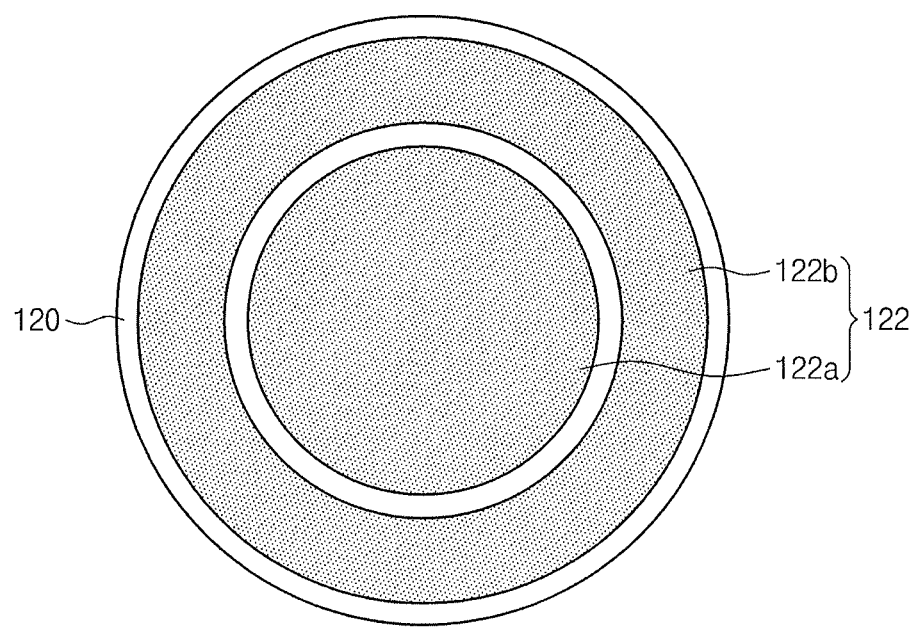
FIG. 1B illustrates a plan view of a dielectric layer of an electrostatic chuck assembly according to an exemplary embodiment.
Figure 1C:
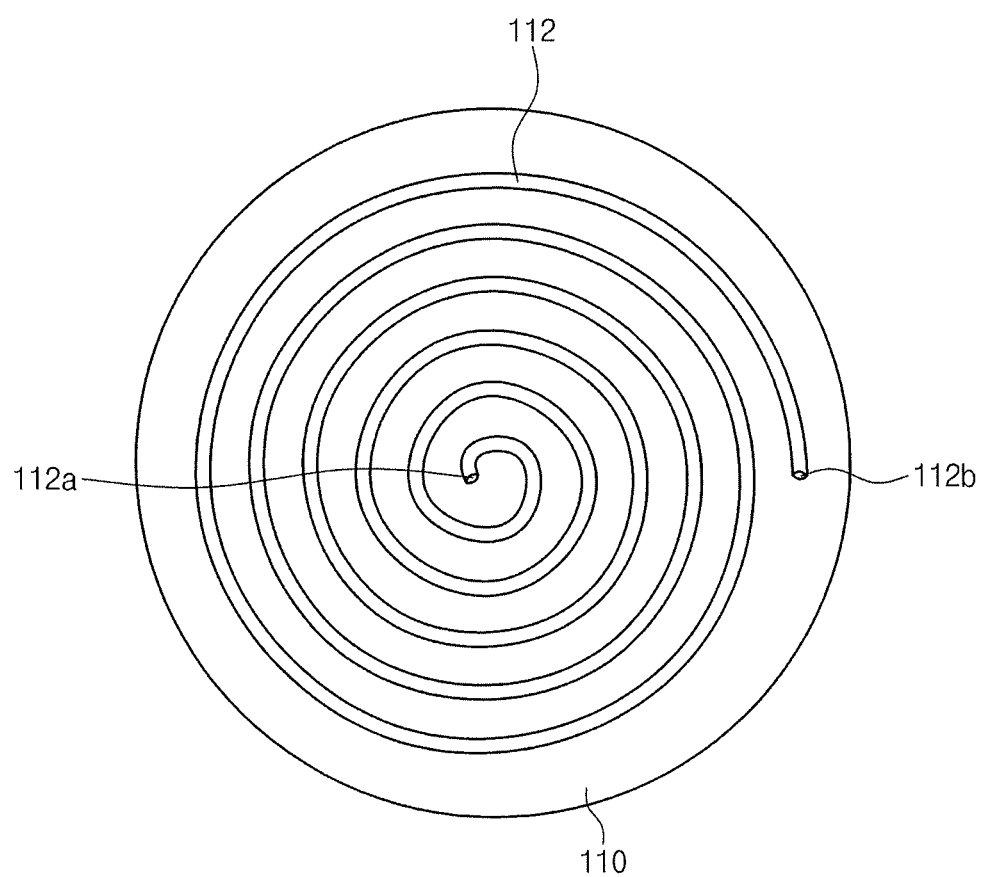
FIG. 1C illustrates a plan view of a base of an electrostatic chuck assembly according to an exemplary embodiment.

FIG. 1A illustrates a schematic view of an electrostatic chuck assembly according to an exemplary embodiment. FIG. 1B illustrates a plan view of a dielectric layer of an electrostatic chuck assembly according to an exemplary embodiment. FIG. 1C illustrates a plan view of a base of an electrostatic chuck assembly according to an exemplary embodiment.

Referring to FIG. 1A, an electrostatic chuck assembly 1 may include an electrostatic chuck 100 adapted to adsorb a substrate 90 such as a silicon wafer and a coolant circulating system 200 configured to control a circulation of coolant in the electrostatic chuck 100.

The electrostatic chuck 100 may include a base 110 having a channel 112 through which the coolant flows and a dielectric layer 120 having an electrostatic electrode 122 embedded therein. The coolant circulating system 200 may include a valve box 210 configured to change a flow direction of the coolant in the base 110, a chiller 230 adapted to communicate the coolant with the valve box 210, e.g., to transfer or provide the coolant to the valve box 210, and a controller 250 electrically connected to the valve box 210 and the chiller 230. The electrical connection may be designated as a dotted arrow. The controller 250 may include a digital input output (DIO) board.

Referring to FIGS. 1A and 1B, the dielectric layer 120 may include an insulator such as ceramic (e.g., $Al_2O_3$, AlN, $Y_2O_3$) or resin (e.g., polyimide). The dielectric layer 120 may have a disk shape whose diameter is less than that of the substrate 90. The dielectric layer 120 may adsorb the substrate 90 by an electrostatic force generating from the electrostatic electrode 122 in response to an electrical power (e.g., a direct current) application thereto.

The electrostatic electrode 122 may be made of metal, for example, W, Cu, Ni, Mo, a Ni—Cr alloy or a Ni—Al alloy. In an embodiment, the electrostatic electrode 122 may be made of conductive ceramic such as WC, MoC or TiN. The electrostatic electrode 122 may be a bipolar electrode including a circular-shaped inner electrode 122a and a loop-shaped outer electrode 122b, as illustrated in FIG. 1B. One of the inner and outer electrodes 122a and 122b may receive a positive voltage, and the other of the inner and outer electrodes 122a and 122b may receive a negative voltage. In an embodiment, the electrostatic electrode 122 may be a monopolar electrode including a single circular electrode that receives a DC voltage.

Referring to FIGS. 1A and 1C, the base 110 may have a disk shape made of metal, for example, Al, Ti, a stainless steel, W or any combination thereof. The electrostatic chuck 100 may be used in a plasma treatment apparatus for carrying out a plasma treatment on the substrate 90. When plasma is generated in a chamber where the electrostatic chuck 100 is installed, the substrate 90 may reach a high temperature, for example, due to the bombardment of cations in the plasma, which may damage the substrate 90 and produce a non-uniform plasma treatment. A cooling of the substrate 90 may be required to produce a uniform plasma treatment without damages to the substrate 90. The base 110 may include the channel 112 through which the coolant flows to cool down the substrate 90. For example, the coolant may be a liquid selected from one or more of water, ethylene glycol, silicone oil, liquid Teflon, or a water-glycol mixture. In an embodiment, the coolant may be a gas such as He and/or Ar.

The channel 112 may have a pipe shape extending helically around a center of the base 110, as illustrated in FIG. 1C. The channel 112 may include a first opening 112a into which the coolant is introduced and a second opening 112b from which the coolant is drained. It should be appreciated that the flow of coolant may be reversed, e.g., the coolant may be introduced into the second opening 112b and may be drained from the first opening 112a. The first opening 112a may be disposed corresponding to a center of the substrate 90 and the second opening 112b may be disposed corresponding to an edge of the substrate 90. In an exemplary embodiment, the coolant circulating system 200 may change the flow direction of the coolant in the channel 112, which will be discussed in detail with reference to FIGS. 2A and 3A.

The valve box 210 may include: a first supply valve 211s and a second supply valve 212s that provide the channel 112 with the coolant fed from the chiller 230; and a first return valve 211r and a second return valve 212r that provide the chiller 230 with the coolant drained from the channel 112. The valves 211s, 212s, 211r and 212r may each be a solenoid valve.

The electrostatic chuck assembly 1 may further include a supply line 251 and a return line 253 for communicating the coolant between the valve box 210 and the chiller 230, e.g., for transferring or providing the coolant from the valve box 210 to the chiller 230. The supply line 251 may include an end connected to the chiller 230 and a branched-out end connected to the first supply valve 211s and the second supply valve 212s. The return line 253 may include an end connected to the chiller 230 and a branched-out end connected to the first return valve 211r and the second return valve 212r. The coolant may flow into the valve box 210 from the chiller 230 through the supply line 251 and may return into the chiller 230 from the valve box 210 through the return line 253.

The electrostatic chuck assembly 1 may further include a forward line 255 and a backward line 257 for communicating the coolant between the valve box 210 and the channel 112. The forward line 255 may include an end connected to the first opening 112a of the channel 112 and a branched-out end connected to the first supply valve 211s and the second return valve 212r. The backward line 257 may include an end connected to the second opening 112b of the channel 112 and a branched-out end connected to the second supply valve 212s and the first return valve 211r.

The coolant may be introduced into the channel 112 to helically flow therethrough. For example, the coolant may flow in a centrifugal direction (also referred to as a forward direction) windingly streaming, e.g., flowing, toward the edge from the center of the substrate 90 with continuously increasing distance from the center of the substrate 90, which will be discussed with reference to FIG. 2B. In an embodiment, the coolant may flow in a centripetal direction (also referred to as a backward direction) windingly streaming toward the center from the edge of the substrate 90 with continuously decreasing distance from the center of the substrate 90, which will be discussed with reference to FIG. 3B. The flow direction of the coolant may be switched based on an operation of the valve box 210. The valve box 210 may be a bidirectional flow (BDF) valve system that may be capable of changing the flow direction of the coolant in the channel 112.

In an exemplary embodiment, the electrostatic chuck assembly 1 may be a single type BDF valve system including a single valve box 210. The forward and backward directions of the coolant may be arbitrarily defined. It should be appreciated that the flow direction of the coolant may be revered, e.g., the centripetal flow direction of the coolant may be referred to as the forward direction and the centrifugal flow direction of the coolant may be referred to as the backward direction.

As one example of the forward flow direction, the coolant may be supplied into the first opening 112a of the channel 112 from the valve box 210 through the forward line 255, and may be drained from the second opening 112b of the channel 112 into the valve box 210 through the backward line 257 after passing through the channel 112. The coolant may have a spiral flow path along the centrifugal direction windingly streaming toward the edge of the substrate 90 from the center of the substrate 90.

As one example of the backward flow direction, the coolant may be supplied into the second opening 112b of the channel 112 from the valve box 210 through the backward line 257, and may be drained from the first opening 112a of the channel 112 into the valve box 210 through the forward line 255 after passing through the channel 112. The coolant may have a spiral flow path along the centripetal direction windingly streaming toward the center of the substrate 90 from the edge of the substrate 90.

Figure 2A:
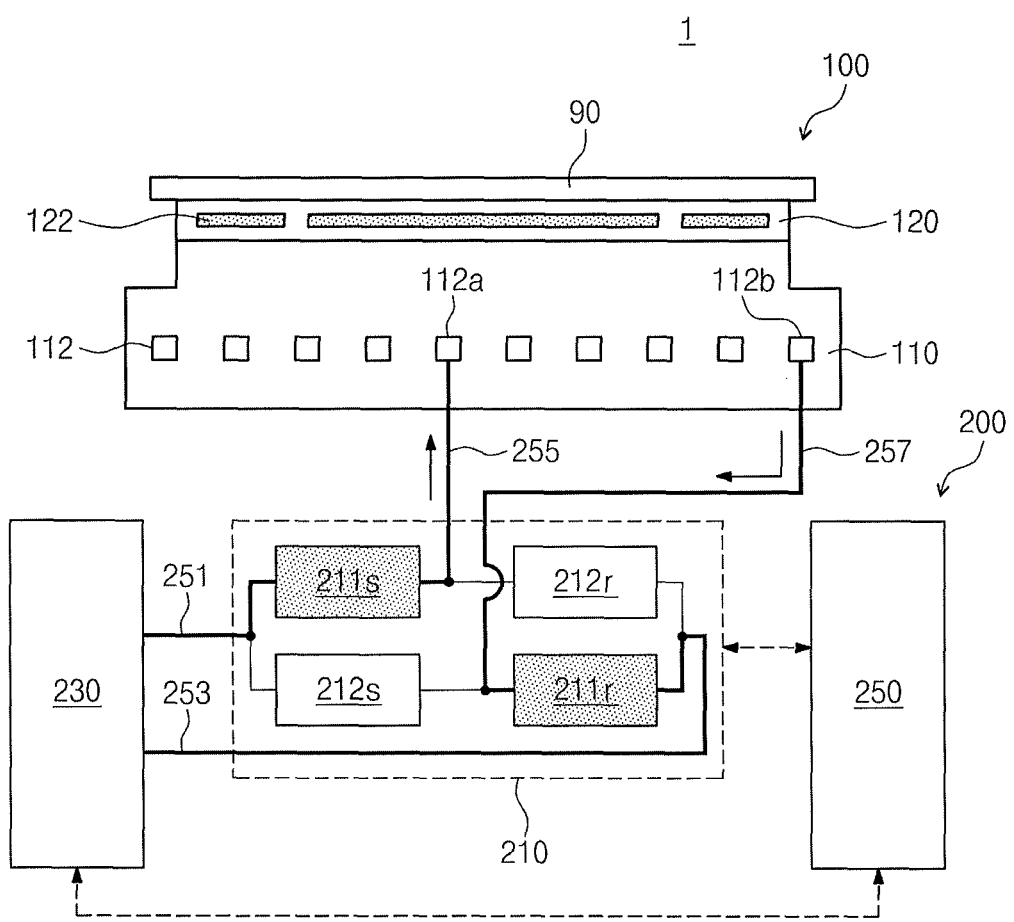
FIG. 2A illustrates a schematic view of a forward flow direction of a coolant in an electrostatic chuck assembly of FIG. 1A.
Figure 2B:
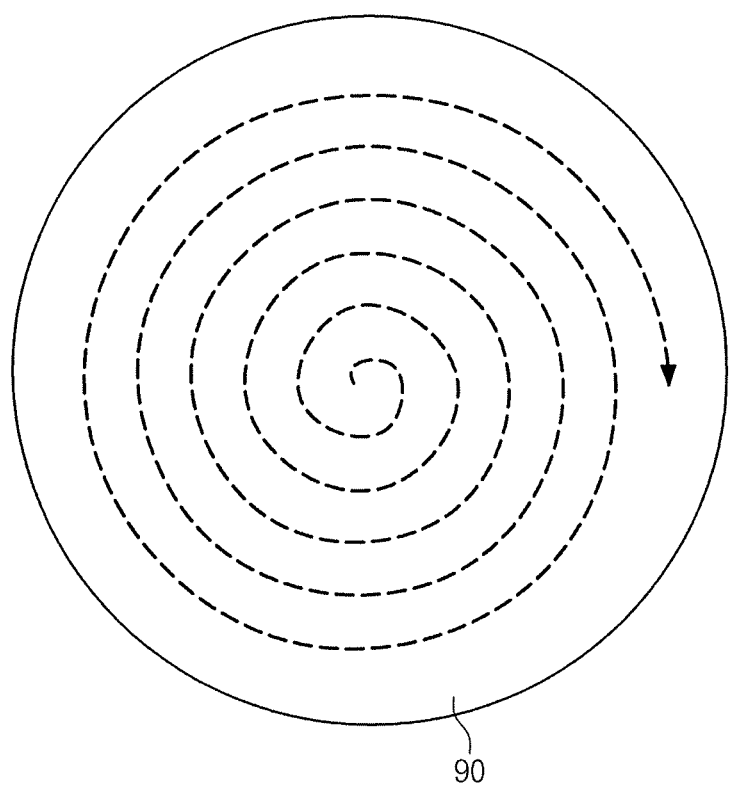
FIG. 2B illustrates a plan view of a forward flow direction of a coolant in an electrostatic chuck assembly of FIG. 1A.

FIG. 2A illustrates a schematic view of a forward flow direction of a coolant in an electrostatic chuck assembly of FIG. 1A. FIG. 2B illustrates a plan view of a forward flow direction of a coolant in an electrostatic chuck assembly of FIG. 1A.

Referring to FIG. 2A, the first supply valve 211s and the first return valve 211r may each be set to have a switch-on state and the second supply valve 212s and the second return valve 212r may each be set to have a switch-off state. The coolant, which is fed into the valve box 210 from the chiller 230 though the supply line 251, may be introduced into the first opening 112a of the channel 112 through the forward line 255 by the switch-on state of the first supply valve 211s.

The coolant, which is introduced into the first opening 112a, may be drained from the second opening 112b after passing through the channel 112. The coolant, which is fed into the valve box 210 from the channel 112 through the backward line 257, may return into the chiller 230 through the return line 253 by the switch-on state of the first return valve 211r.

The forward flow direction of the coolant may be represented by a bold solid line. The switch-on states of the first supply valve 211s and the first return valve 211r may be designated by dotted hatchings.

Referring to FIG. 2B, owing to the introduction of the coolant through the first opening 112a (also as referred to as a center feed) discussed in FIG. 2A, the coolant may circulate in the forward flow direction. For example, the coolant may travel along the centrifugal direction (represented by a dotted arrow) windingly stream toward the edge of the substrate 90 from the center of the substrate 90 with continuously increasing distance from the center of the substrate 90, and the substrate 90 may be cooled.

The substrate 90 may be cooled down unevenly. For example, the coolant may be supplied into the center of the substrate 90, and a temperature of the coolant may be increased, for example, due to a heat transfer from the substrate 90, while flowing toward the edge of the substrate 90. The edge of the substrate 90 may have a temperature greater than that of the center of the substrate 90. In an exemplary embodiment, the flow direction of the coolant may be reversed to achieve a uniform temperature distribution of the substrate 90, which will be discussed with reference to FIGS. 3A and 3B.

Figure 3A:
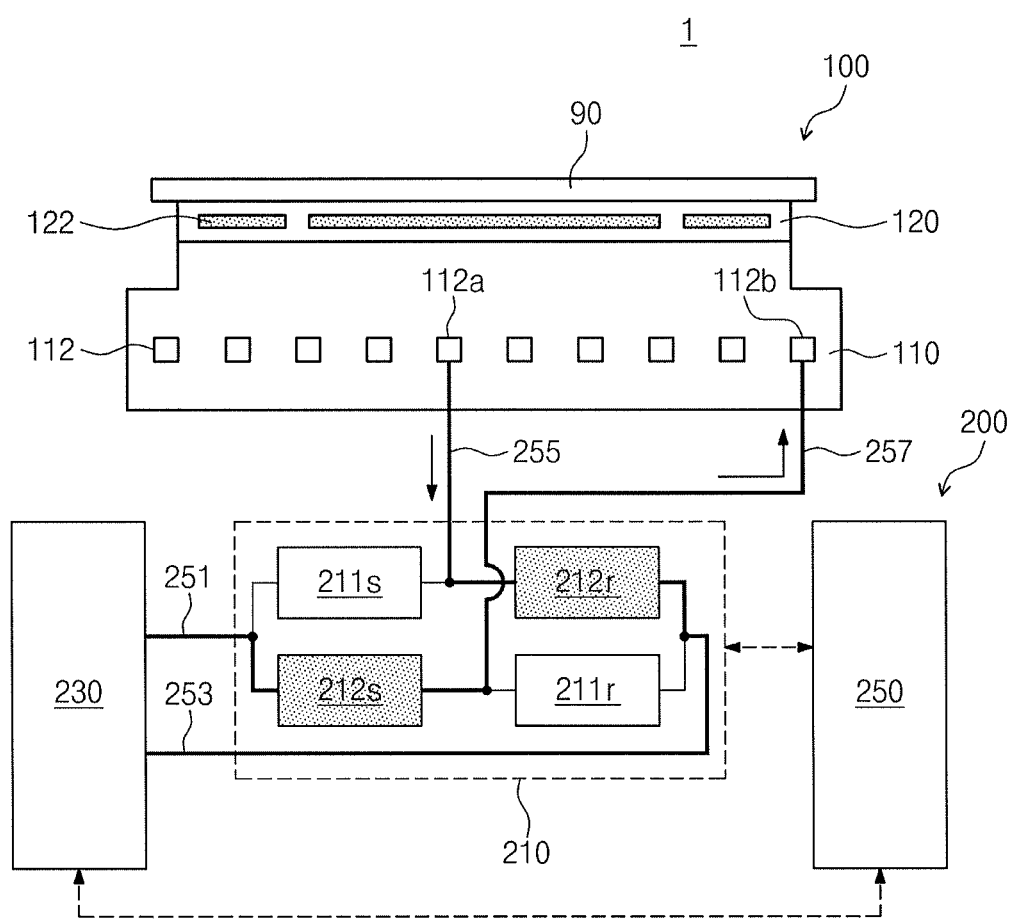
FIG. 3A illustrates a schematic view of a backward flow direction of a coolant in an electrostatic chuck assembly of FIG. 1A.
Figure 3B:
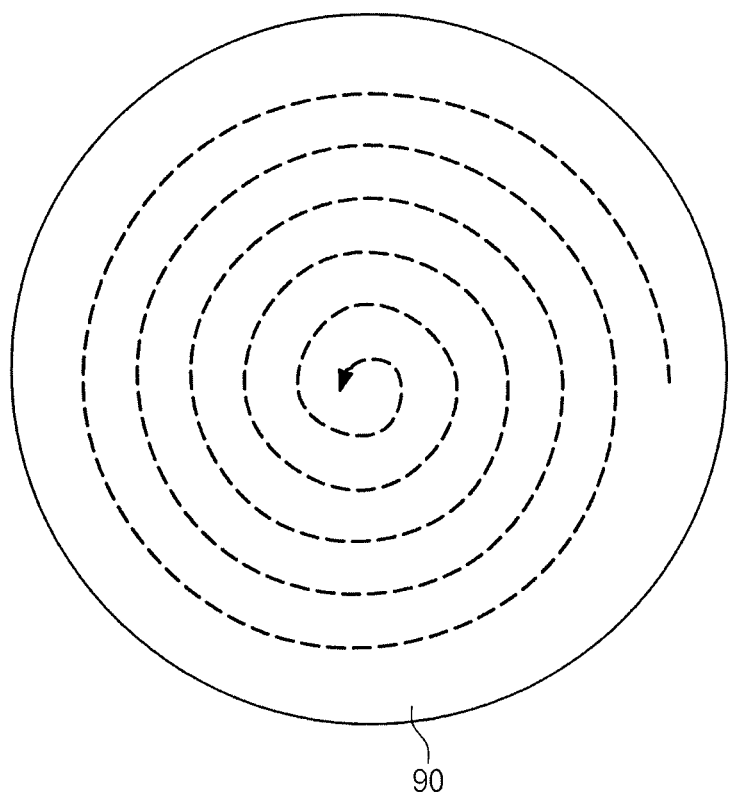
FIG. 3B illustrates a plan view of a backward flow direction of a coolant in an electrostatic chuck assembly of FIG. 1A.

FIG. 3A illustrates a schematic view of a backward flow direction of a coolant in an electrostatic chuck assembly of FIG. 1A. FIG. 3B illustrates a plan view of a backward flow direction of a coolant in an electrostatic chuck assembly of FIG. 1A.

Referring to FIG. 3A, the first supply valve 211s and the first return valve 211r may each be set to have a switch-off state and the second supply valve 212s and the second return valve 212r may each be set to have a switch-on state. The coolant, which is fed into the valve box 210 from the chiller 230 though the supply line 251, may be introduced into the second opening 112b of the channel 112 through the backward line 257 by the open state of the second supply valve 212s.

The coolant, which is introduced into the second opening 112a, may be drained from the first opening 112a after passing through the channel 112. The coolant, which is fed into the valve box 210 from the channel 112 through the forward line 255, may return into the chiller 230 through the return line 253 by the open state of the second return valve 212r.

The backward flow direction of the coolant may be represented by a bold solid line. The switch-on states of the second supply valve 212s and the second return valve 212r may be designated by dotted hatchings.

Referring to FIG. 3B, owing to the introduction of the coolant through the second opening 112b (also referred to as an edge feed) discussed in FIG. 3A, the coolant may circulate in the backward flow direction. For example, the coolant may travel along the centripetal direction (represented by a dotted arrow) windingly stream toward the center of the substrate 90 from the edge of the substrate 90 with continuously decreasing distance from the center of the substrate 90, and the substrate 90 may be cooled. The coolant may be supplied into the edge of the substrate 90, and a temperature difference of the substrate 90, for example, due to the forward flow of the coolant, may be reduced or eliminated.

The exemplary embodiment describes the coolant supply in a sequence of the backward direction after the forward direction. It should be appreciated that the sequence of coolant supply may be reversed. For example, the edge feed (i.e., the backward directional supply of the coolant) may be followed by the center feed (i.e., the forward directional supply of the coolant) to uniformly cool the substrate 90 by eliminating or reducing the temperature difference, for example, due to the backward flow direction of the coolant.

Figure 4:
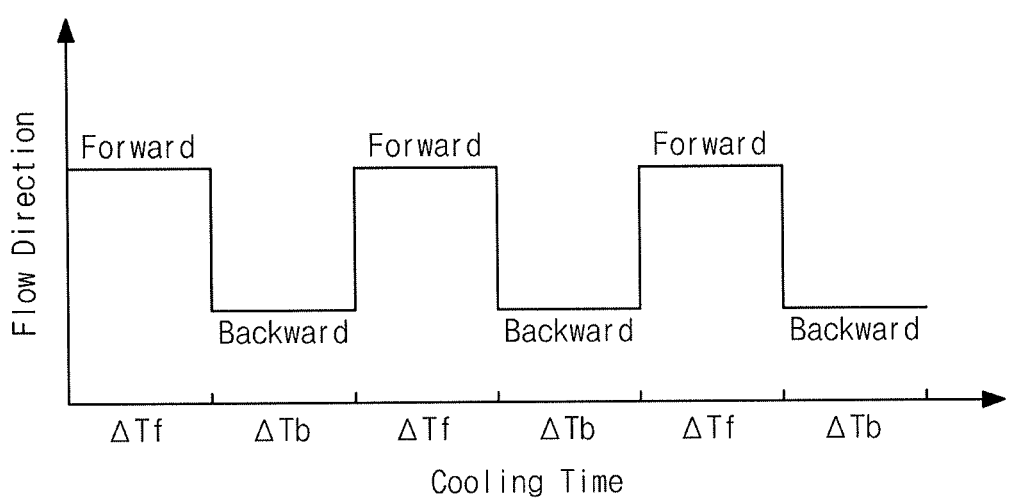
FIG. 4 illustrates a graph of a bidirectional flow cycle using an electrostatic chuck assembly of FIG. 1A.

FIG. 4 illustrates a graph of a bidirectional flow cycle using an electrostatic chuck assembly of FIG. 1A. The graph has a horizontal axis expressing a cooling time of the substrate and a vertical axis expressing the flow direction of the coolant.

Referring to FIG. 4, the flow direction of the coolant may be reversed or switched at least one time. For example, the substrate 90 may be cooled down by repeatedly performing the forward flow direction of the coolant according to the center feed, as illustrated in FIG. 2A, and the backward flow direction of the coolant according to the edge feed, as illustrated in FIG. 3A. The forward flow direction of the coolant may maintain for a first time ΔTf, and the backward flow direction of the coolant may maintain for a second time ΔTb.

The first time ΔTf may be substantially identical to the second time ΔTb. For example, the first time ΔTf and the second time ΔTb may each have a few seconds to tens of seconds (e.g., about 10 seconds). The substrate 90 may be cooled down for a few minutes to tens of minutes (e.g., about 30 minutes). A target temperature of the substrate 90 may be about 30° C. to about 70° C.

Referring to FIGS. 1A and 4, the controller 250 may control the bidirectional flow cycle of the coolant. For example, receiving information on a temperature of the substrate 90 and/or a temperature of the electrostatic chuck 100, the controller 250 may suitably adjust the first time ΔTf and the second time ΔTb.

Figure 5A:
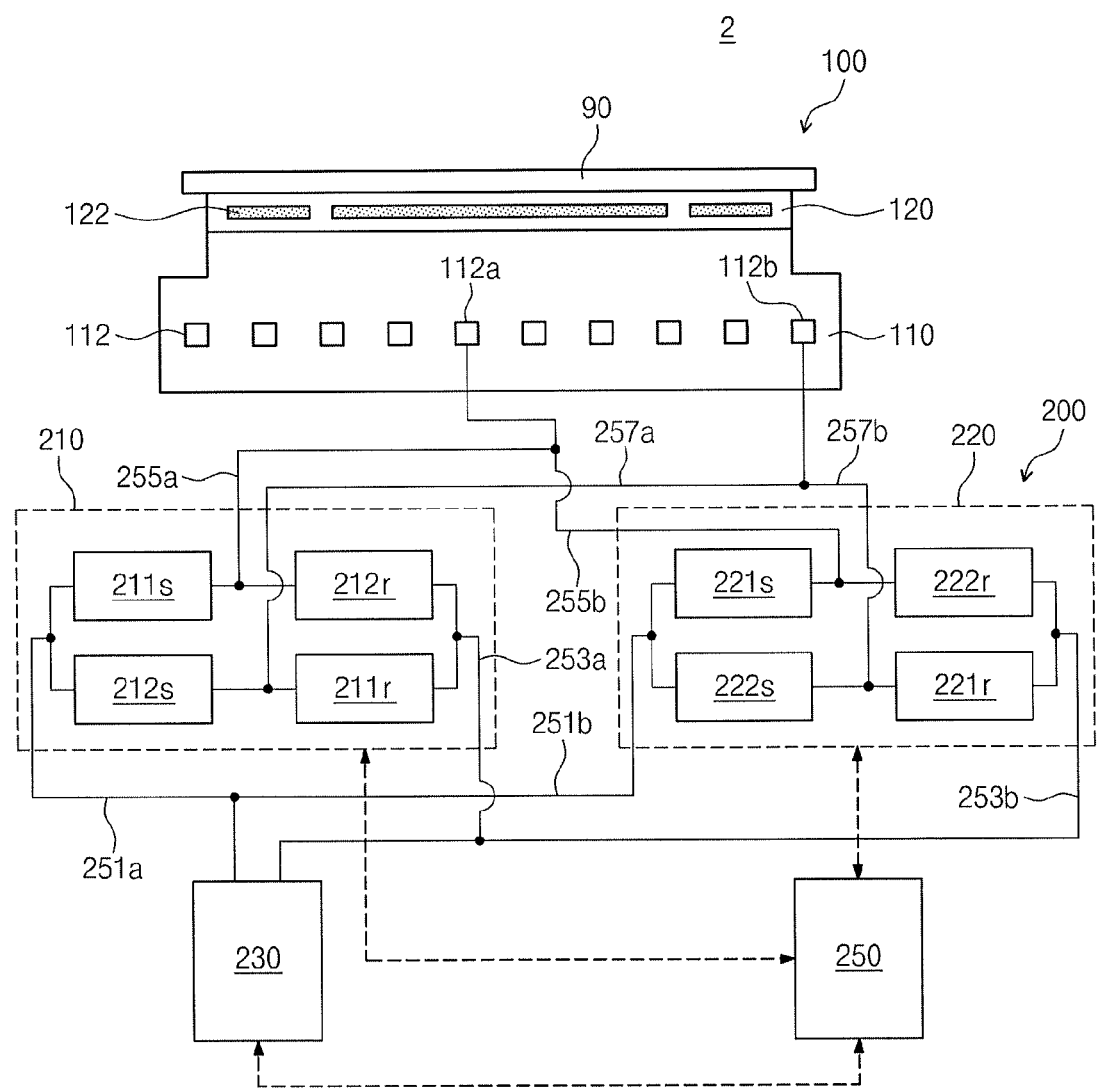
FIG. 5A illustrates a schematic view of an electrostatic chuck assembly according to an exemplary embodiment.

FIG. 5A illustrates a schematic view of an electrostatic chuck assembly according to an exemplary embodiment. In the description of the embodiment that follows, the description of features that are the same as those in the embodiment of FIG. 1A may be omitted in order to avoid repetition.

Referring to FIG. 5A, an electrostatic chuck assembly 2 may include a dual type bidirectional flow valve system. In an exemplary embodiment, the electrostatic chuck assembly 2 may include the valve box 210 (hereinafter referred to as a first valve box) and further include a valve box 220 (hereinafter referred to as a second valve box).

The first valve box 210 and the second valve box 220 may be commonly connected to the chiller 230. The chiller 230 may communicate the coolant with each of the first and second valve boxes 210 and 220. The controller 250 may be electrically connected to the first valve box 210 and the second valve box 220. The controller 250 may independently or separately control the first valve box 210 and the second valve box 220.

The first valve box 210 may include the first supply valve 211s and the first return valve 211r, which may each be set to have a switch-on state during the forward flow direction of the coolant and set to have a switch-off state during the backward flow direction of the coolant; and the second supply valve 212s and the second return valve 212r, which may each be set to have a switch-on state during the backward flow direction of the coolant and set to have a switch-off state during the forward flow direction of the coolant.

The second valve box 220 may include a first supply valve 221s and the first return valve 221r, which may each be set to have a switch-on state during the forward flow direction of the coolant and set to have a switch-off state during the backward flow direction of the coolant; and the second supply valve 222s and the second return valve 222r, which may each be set to have a switch-on state during the backward flow direction of the coolant and set to have a switch-off state during the forward flow direction of the coolant. Likely the valves 211s, 212s, 211r and 212r of the first valve box 210, the valves 221s, 222s, 221r and 222r of the second valve box 220 may each be a solenoid valve.

The electrostatic chuck assembly 2 may further include: a first supply line 251a and a first return line 253a for communicating the coolant between the first valve box 210 and the chiller 230; and a second supply line 251b and a second return line 253b for communicating the coolant between the second valve box 220 and the chiller 230.

The first supply line 251a may include an end, which is combined with the second supply line 251b, connected to the chiller 230 and a branched-out end connected to the first supply valve 211s and the second supply valve 212s of the first valve box 210. The first return line 253a may include an end, which is combined with the second return line 253b, connected to the chiller 230 and a branched-out end connected to the first return valve 211r and the second return valve 212r of the first valve box 210.

The second supply line 251b may include an end, which is combined with the first supply line 251a, connected to the chiller 230 and a branched-out end connected to the first supply valve 221s and the second supply valve 222s of the second valve box 220. The second return line 253b may include an end, which is combined with the first return line 253a, connected to the chiller 230 and a branched-out end connected to the first return valve 221r and the second return valve 222r of the second valve box 220.

The coolant may flow into the first valve box 210 and the second valve box 220 from the chiller 230 through the first supply line 251a and the second supply line 251b, respectively, and may return into the chiller 230 from the first valve box 210 and the second valve box 220 through the first return line 253a and the second return line 253b, respectively.

The electrostatic chuck assembly 2 may further include: a first forward line 255a and a first backward line 257a for communicating the coolant between the first valve box 210 and the channel 112; and a second forward line 255b and a second backward line 257b for communicating the coolant between the second valve box 220 and the channel 112.

The first forward line 255a may include an end, which is combined with the second forward line 255b, connected to the first opening 112a of the channel 112 and a branched-out end connected to the first supply valve 211s and the second return valve 212r of the first valve box 210. The first backward line 257a may include an end, which is combined with the second backward line 257b, connected to the second opening 112b of the channel 112 and a branched-out end connected to the second supply valve 212s and the first return valve 211r of the first valve box 210.

The second forward line 255b may include an end, which is combined with the first forward line 255a, connected to the first opening 112a of the channel 112 and a branched-out end connected to the first supply valve 221s and the second return valve 222r of the second valve box 220. The second backward line 257b may include an end, which is combined with the first backward line 257a, connected to the second opening 112b of the channel 112 and a branched-out end connected to the second supply valve 222s and the first return valve 221r of the second valve box 220.

As one example of the forward flow direction, the coolant may be supplied into the first opening 112a of the channel 112 from the first valve box 210 through the first forward line 255a and/or from the second valve box 220 through the second forward line 255b, and may be drained from the second opening 112b of the channel 112 into the first valve box 210 through the first backward line 257a and/or into the second valve box 220 through the second backward line 257b after passing through the channel 112. The coolant may have a spiral flow path along the centrifugal direction windingly streaming toward the edge of the substrate 90 from the center of the substrate 90.

As one example of the backward flow direction, the coolant may be supplied into the second opening 112b of the channel 112 from the first valve box 210 through the first backward line 257a and/or from the second valve box 220 through the second backward line 257b, and may be drained from the first opening 112a of the channel 112 into the first valve box 210 through the first forward line 255a and/or into the second valve box 220 through the second forward line 255b after passing through the channel 112. The coolant may have a spiral flow path along the centripetal direction windingly streaming toward the center of the substrate 90 from the edge of the substrate 90.

Figure 5B:
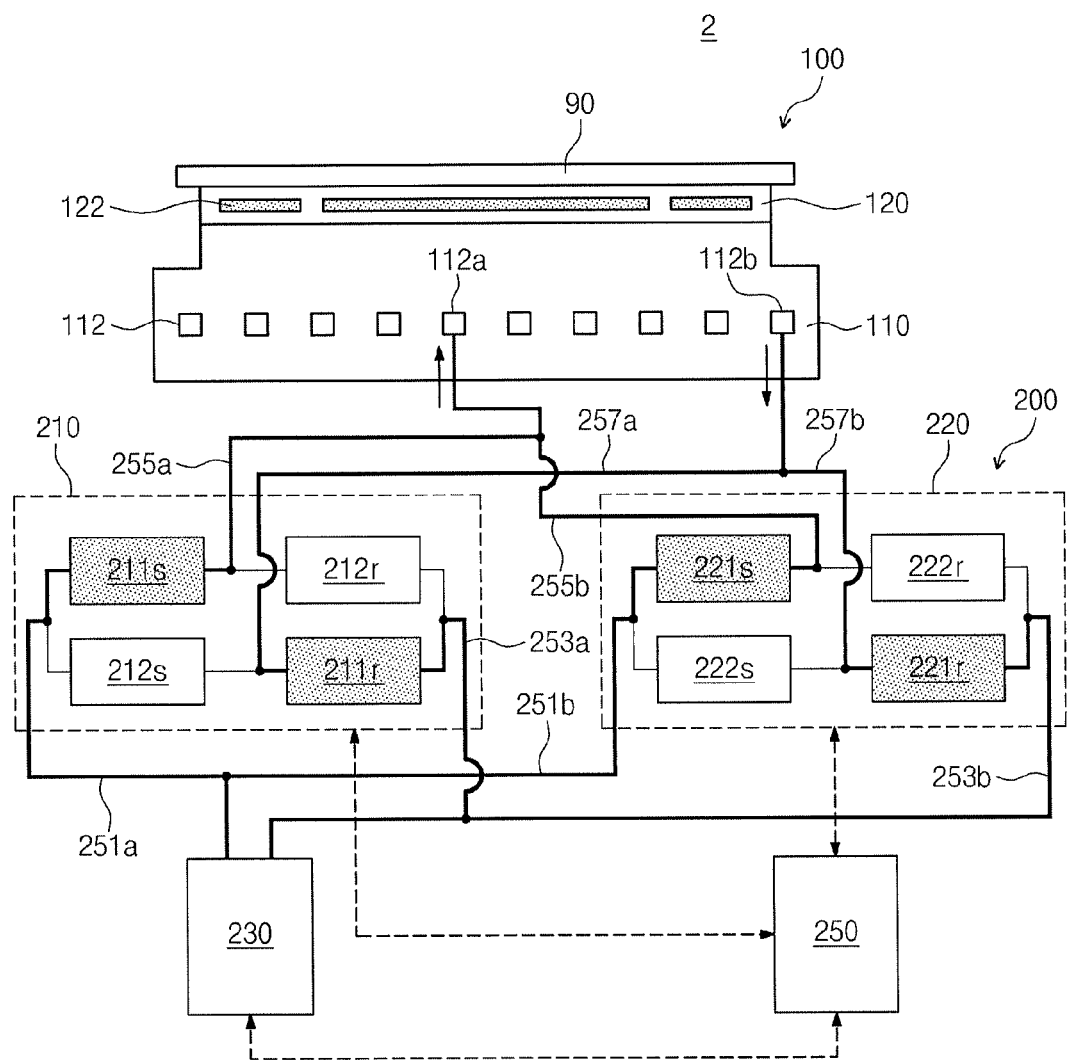
FIG. 5B illustrates a schematic view of a forward flow direction of a coolant in an electrostatic chuck assembly of FIG. 5A.

FIG. 5B illustrates a schematic view of a forward flow direction of a coolant in an electrostatic chuck assembly of FIG. 5A.

Referring to FIG. 5B, the first supply valve 211s and the first return valve 211r of the first valve box 210 may each be set to have the switch-on state and the second supply valve 212s and the second return valve 212r of the first valve box 210 may each be set to have the switch-off state. The first supply valve 221s and the first return valve 221r of the second valve box 220 may each be set to have the switch-on state and the second supply valve 222s and the second return valve 222r of the second valve box 220 may each be set to have the switch-off state. These states of the valves may enable the coolant to flow in the forward direction, i.e., the centrifugal direction.

The coolant may be divided and may flow into the first valve box 210 and the second valve box 220 from the chiller 230 through the first supply line 251a and the second supply line 251b. The coolant, which is fed into the first valve box 210 from the chiller 230 though the first supply line 251a, may be introduced into the first opening 112a of the channel 112 through the first forward line 255a by the switch-on state of the first supply valve 211s. The coolant, which is fed into the second valve box 220 from the chiller 230 though the second supply line 251b, may be introduced into the first opening 112a of the channel 112 through the second forward line 255b by the switch-on state of the first supply valve 221s.

The coolant, which is introduced into the first opening 112a through the first forward line 255a and the second forward line 255b, may be drained from the second opening 112b after passing through the channel 112. The coolant, which is drained from the second opening 112b, may flow into the first backward line 257a and the second backward line 257b.

The coolant, which is fed into first the valve box 210 from the channel 112 through the first backward line 257a, may return into the chiller 230 through the first return line 253a by the switch-on state of the first return valve 211r. The coolant, which is fed into second the valve box 220 from the channel 112 through the second backward line 257b, may return into the chiller 230 through the second return line 253b by the switch-on state of the first return valve 221r. In an exemplary embodiment, the coolant flowing in the first return line 253a may be mixed with the coolant flowing in the second return line 253b, before returning into the chiller 230.

The forward flow direction of the coolant may be represented by a bold solid line. Dotted hatchings may be used to represent the switch-on states of the first supply valve 211s and the first return valve 211r of the first valve box 210 and the first supply valve 221s and the first return valve 221r of the second valve box 220.

Figure 5C:
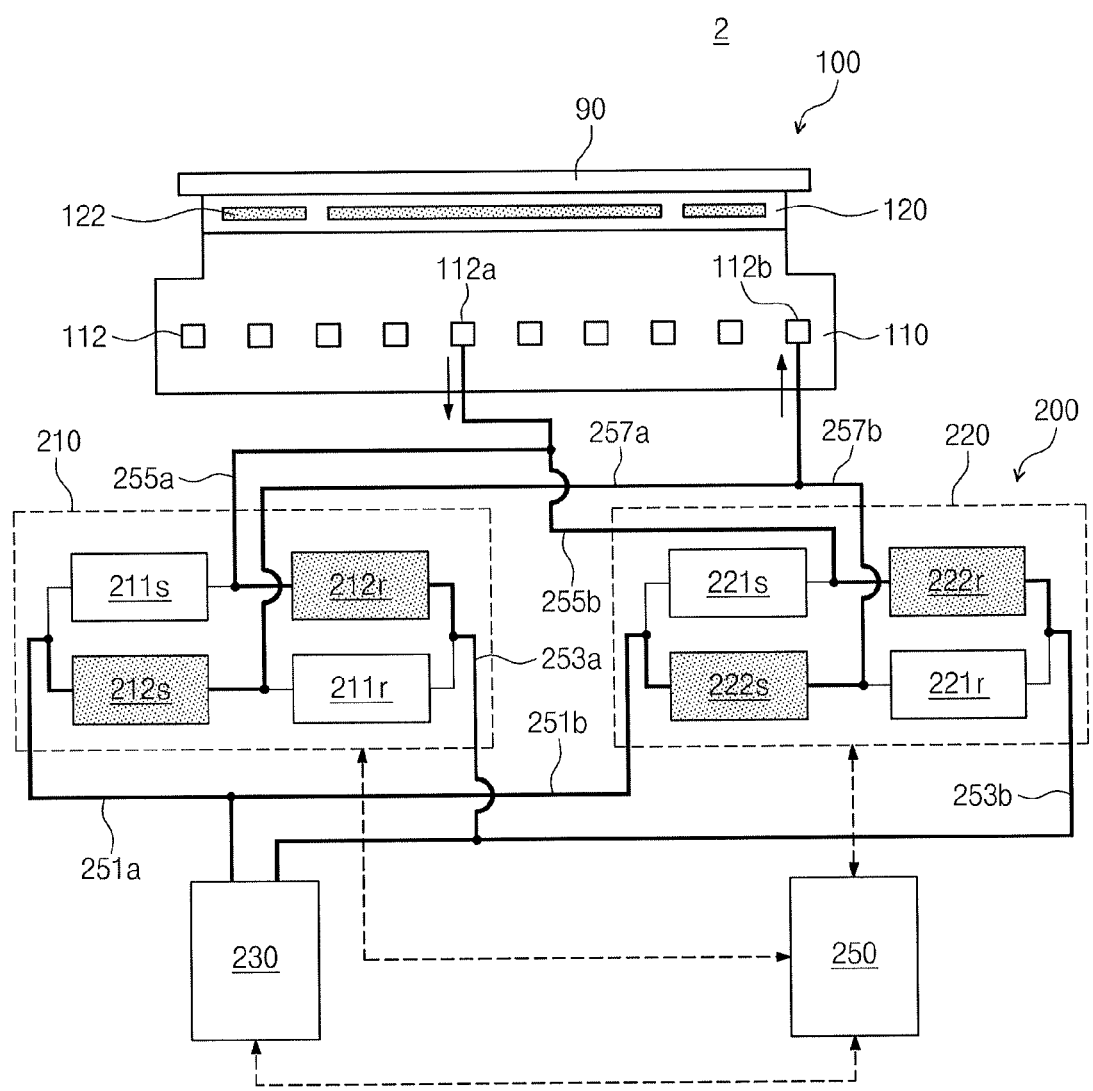
FIG. 5C illustrates a schematic view of a backward flow direction of a coolant in an electrostatic chuck assembly of FIG. 5A.

FIG. 5C illustrates a schematic view of a backward flow direction of a coolant in an electrostatic chuck assembly of FIG. 5A.

Referring to FIG. 5C, the first supply valve 211s and the first return valve 211r of the first valve box 210 may each be set to have the switch-off state and the second supply valve 212s and the second return valve 212r of the first valve box 210 may each be set to have the switch-on state. The first supply valve 221s and the first return valve 221r of the second valve box 220 may each be set to have the switch-off state and the second supply valve 222s and the second return valve 222r of the second valve box 220 may each be set to have the switch-on state. These states of the valves may enable the coolant to flow in the backward direction, i.e., the centripetal direction.

The coolant may be divided and may flow into the first valve box 210 and the second valve box 220 from the chiller 230 through the first supply line 251a and the second supply line 251b. The coolant, which is fed into the first valve box 210 from the chiller 230 though the first supply line 251a, may be introduced into the second opening 112b of the channel 112 through the first backward line 257a by the switch-on state of the second supply valve 212s. The coolant, which is fed into the second valve box 220 from the chiller 230 though the second supply line 251b, may be introduced into the second opening 112b of the channel 112 through the second backward line 257b by the switch-on state of the second supply valve 222s.

The coolant, which is introduced into the second opening 112b through the first backward line 257a and the second backward line 257b, may be drained from the first opening 112a after passing through the channel 112. The coolant, which is drained from the first opening 112a, may flow into the first forward line 255a and the second forward line 255b.

The coolant, which is fed into first the valve box 210 from the channel 112 through the first forward line 255a, may return into the chiller 230 through the first return line 253a by the switch-on state of the second return valve 212r. The coolant, which is fed into second the valve box 220 from the channel 112 through the second forward line 255b, may return into the chiller 230 through the second return line 253b by the switch-on state of the second return valve 222r. In an exemplary embodiment, the coolant flowing in the first return line 253a may be mixed with the coolant flowing in the second return line 253b, before returning into the chiller 230.

The backward flow direction of the coolant may be represented by a bold solid line. Dotted hatchings may be used to represent the switch-on states of the second supply valve 212s and the second return valve 212r of the first valve box 210 and the second supply valve 222s and the second return valve 222r of the second valve box 220.

As discussed with reference to FIGS. 5B and 5C, the substrate 90 may be cooled down using the bidirectional flow of the coolant by simultaneously operating the first valve box 210 and the second valve box 220. In an embodiment, the substrate 90 may be cooled down using the bidirectional flow of the coolant by operating one of the first valve box 210 and the second valve box 220. Differently, the substrate 90 may be cooled down using the forward flow direction of the coolant by operating one of the first valve box 210 and the second valve box 220 and the backward flow direction of the coolant by operating the other of the first valve box 210 and the second valve box 220.

Figure 6A:
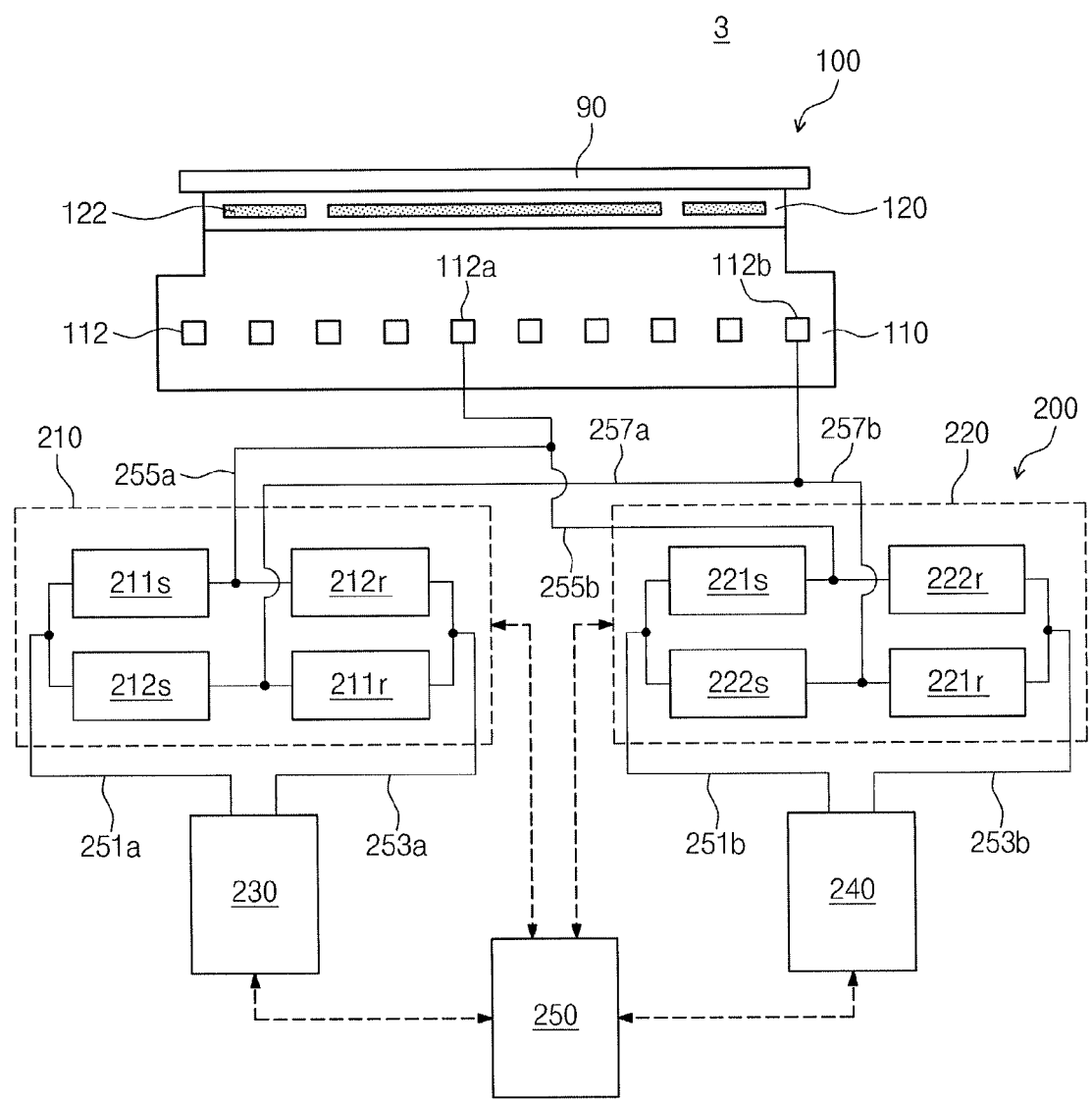
FIG. 6A illustrates a schematic view of an electrostatic chuck assembly according to an exemplary embodiment.

FIG. 6A illustrates a schematic view of an electrostatic chuck assembly according to an exemplary embodiment. In the description of the embodiment that follows, the description of features that are the same as those in the embodiment of FIG. 5A may be omitted in order to avoid repetition.

Referring to FIG. 6A, an electrostatic chuck assembly 3 may be the dual type bidirectional flow valve system including the first valve box 210 and the second valve box 220. The electrostatic chuck assembly 3 may include the chiller 230 (hereinafter referred to as a first chiller) for communicating the coolant with the first valve box 210 and may further include a chiller 240 (hereinafter referred to as a second chiller) for communicating the coolant with the second valve box 220.

The first chiller 230 may be configured to set the coolant to have a first temperature and the second chiller 240 may be configured to set the coolant to have a second temperature substantially identical to or different from the first temperature. For example, the first chiller 230 may set the coolant to have a higher temperature and the second chiller 240 may set the coolant to have a lower temperature.

The controller 250 may be electrically connected to the first valve box 210 and the second valve box 220. The controller 250 may independently or separately control the first valve box 210 and the second valve box 220.

The first valve box 210 may include the first supply valve 211s and the first return valve 211r, which may each be set to have the switch-on state during the forward flow direction of the coolant and set to have the switch-off state during the backward flow direction of the coolant; and the second supply valve 212s and the second return valve 212r, which may each be set to have the switch-on state during the backward flow direction of the coolant and set to have the switch-off state during the forward flow direction of the coolant.

The second valve box 220 may include the first supply valve 221s and the first return valve 221r, which may each be set to have the switch-on state during the forward flow direction of the coolant and set to have the switch-off state during the backward flow direction of the coolant; and the second supply valve 222s and the second return valve 222r, which may each be set to have the switch-on state during the backward flow direction of the coolant and set to have the switch-off state during the forward flow direction of the coolant.

The electrostatic chuck assembly 3 may further include: the first supply line 251a and the first return line 253a for communicating the coolant between the first valve box 210 and the first chiller 230; and the second supply line 251b and the second return line 253b for communicating the coolant between the second valve box 220 and the second chiller 240.

The first supply line 251a may include an end connected to the first chiller 230 and a branched-out end connected to the first supply valve 211s and the second supply valve 212s of the first valve box 210. The first return line 253a may include an end connected to the first chiller 230 and a branched-out end connected to the first return valve 211r and the second return valve 212r of the first valve box 210.

The second supply line 251b may include an end connected to the second chiller 240 and a branched-out end connected to the first supply valve 221s and the second supply valve 222s of the second valve box 220. The second return line 253b may include an end connected to the second chiller 240 and a branched-out end connected to the first return valve 221r and the second return valve 222r of the second valve box 220.

The coolant may be supplied into the first valve box 210 from the first chiller 230 through the first supply line 251a, and may return into the first chiller 230 from the first valve box 210 through the first return line 253a. The coolant may be supplied into the second valve box 220 from the second chiller 240 through the second supply line 251b, and may return into the second chiller 240 from the second valve box 220 through the second return line 253b.

The electrostatic chuck assembly 3 may further include: the first forward line 255a and the first backward line 257a for communicating the coolant between the first valve box 210 and the channel 112; and the second forward line 255*b* and the second backward line 257*b* for communicating the coolant between the second valve box 220 and the channel 112.

The first forward line 255*a* may include an end, which is combined with the second forward line 255*b*, connected to the first opening 112*a* of the channel and a branched-out end connected to the first supply valve 211*s* and the second return valve 212*r* of the first valve box 210. The first backward line 257*a* may include an end, which is combined with the second backward line 257*b*, connected to the second opening 112*b* of the channel 112 and a branched-out end connected to the second supply valve 212*s* and the first return valve 211*r* of the first valve box 210.

The second forward line 255*b* may include an end, which is combined with the first forward line 255*a*, connected to the first opening 112*a* of the channel and a branched-out end connected to the first supply valve 221*s* and the second return valve 222*r* of the second valve box 220. The second backward line 257*b* may include an end, which is combined with the first backward line 257*a*, connected to the second opening 112*b* of the channel 112 and a branched-out end connected to the second supply valve 222*s* and the first return valve 221*r* of the second valve box 220.

As one example of the forward flow direction, the coolant may be supplied into the first opening 112*a* of the channel 112 from the first valve box 210 through the first forward line 255*a* and/or from the second valve box 220 through the second forward line 255*b*, and may be drained from the second opening 112*b* of the channel 112 into the first valve box 210 through the first backward line 257*a* and/or into the second valve box 220 through the second backward line 257*b* after passing through the channel 112. The coolant may have a spiral flow path along the centrifugal direction windingly streaming toward the edge of the substrate 90 from the center of the substrate 90.

As one example of the backward flow direction, the coolant may be supplied into the second opening 112*b* of the channel 112 from the first valve box 210 through the first backward line 257*a* and/or from the second valve box 220 through the second backward line 257*b*, and may be drained from the first opening 112*a* of the channel 112 into the first valve box 210 through the first forward line 255*a* and/or into the second valve box 220 through the second forward line 255*b* after passing through the channel 112. The coolant may have a spiral flow path along the centripetal direction windingly streaming toward the center of the substrate 90 from the edge of the substrate 90.

Figure 6B:
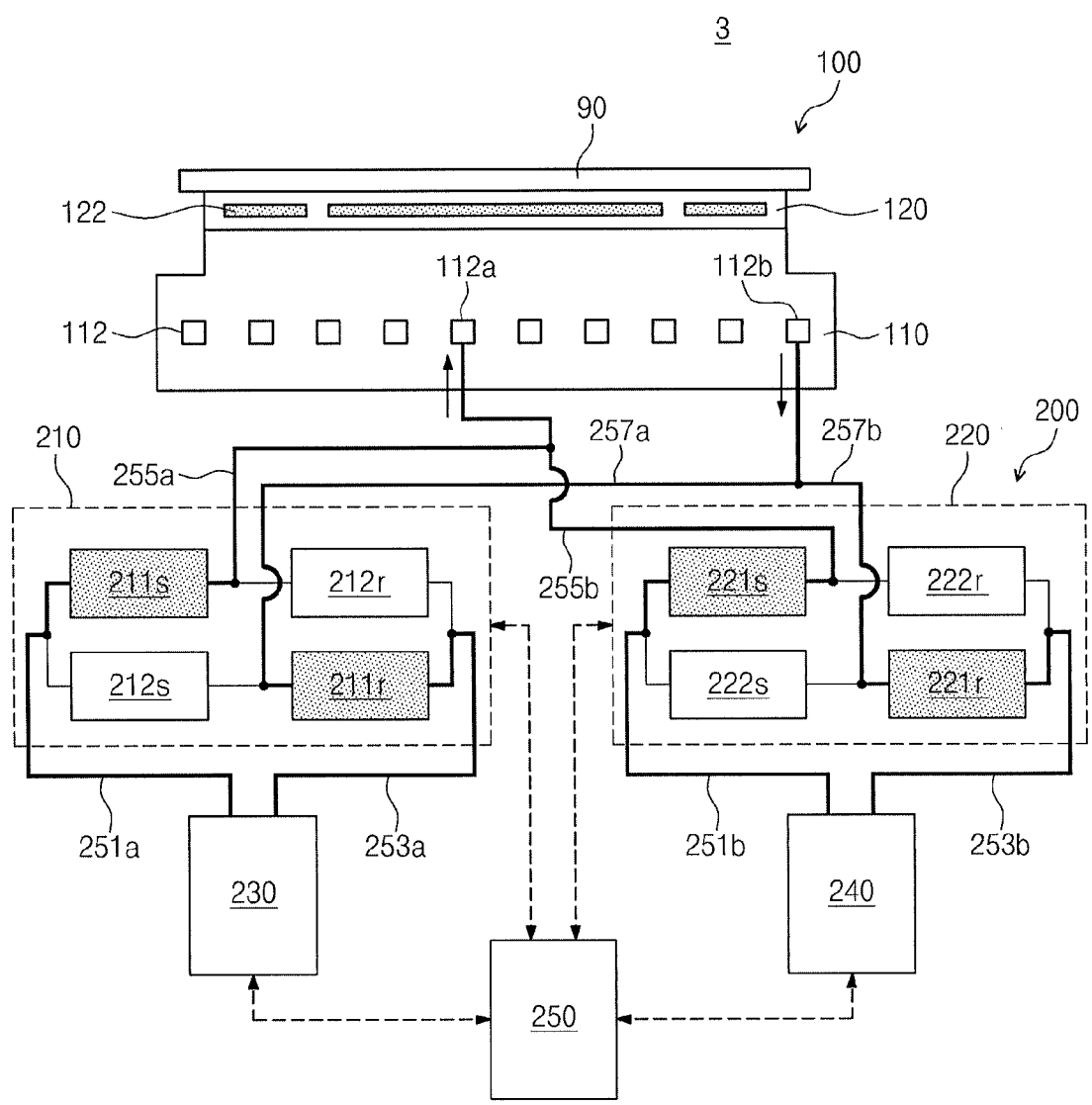
FIG. 6B illustrates a schematic view of a forward flow direction of a coolant in an electrostatic chuck assembly of FIG. 6A.

FIG. 6B illustrates a schematic view of a forward flow direction of a coolant in an electrostatic chuck assembly of FIG. 6A.

Referring to FIG. 6B, the first supply valve 211*s* and the first return valve 211*r* of the first valve box 210 may each be set to have the switch-on state and the second supply valve 212*s* and the second return valve 212*r* of the first valve box 210 may each be set to have the switch-off state. The first supply valve 221*s* and the first return valve 221*r* of the second valve box 220 may each be set to have the switch-on state and the second supply valve 222*s* and the second return valve 222*r* of the second valve box 220 may each be set to have the switch-off state. These states of the valves may enable the coolant to flow in the forward direction, i.e., the centrifugal direction.

The coolant may flow into the first valve box 210 from the first chiller 230 through the first supply line 251*a*. The coolant, which is fed into the first valve box 210, may be introduced into the first opening 112*a* of the channel 112 through the first forward line 255*a* by the switch-on state of the first supply valve 211*s*.

The coolant may flow into the second valve box 220 from the second chiller 240 through the second supply line 251*b*. The coolant, which is fed into the second valve box 220, may be introduced into the second opening 112*b* of the channel 112 through the second forward line 255*b* by the switch-on state of the first supply valve 221*s*.

The coolant, which is introduced into the first opening 112*a* through the first forward line 255*a* and the second forward line 255*b*, may be drained from the second opening 112*b* after passing through the channel 112. The coolant, which is drained from the second opening 112*b*, may flow into the first backward line 257*a* and the second backward line 257*b*.

The coolant, which is fed into first the valve box 210 from the channel 112 through the first backward line 257*a*, may return into the first chiller 230 through the first return line 253*a* by the switch-on state of the first return valve 211*r*. The coolant, which is fed into second the valve box 220 from the channel 112 through the second backward line 257*b*, may return into the second chiller 240 through the second return line 253*b* by the switch-on state of the first return valve 221*r*.

The forward flow direction of the coolant may be represented by a bold solid line. Dotted hatchings may be used to represent the switch-on states of the first supply valve 211*s* and the first return valve 211*r* of the first valve box 210 and the first supply valve 221*s* and the first return valve 221*r* of the second valve box 220.

Figure 6C:
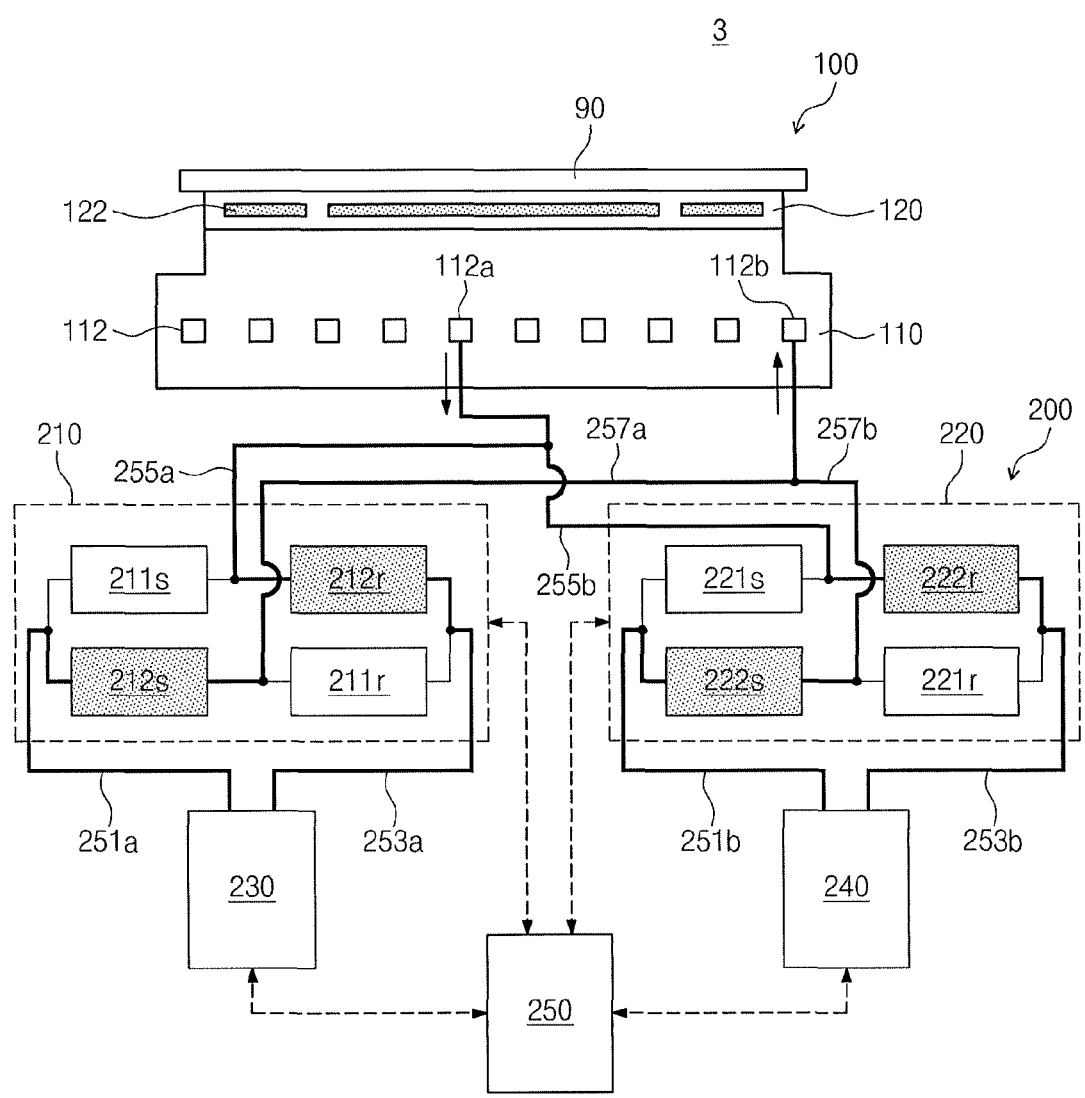
FIG. 6C illustrates a schematic view of a backward flow direction of a coolant in an electrostatic chuck assembly of FIG. 6A.

FIG. 6C illustrates a schematic view of a backward flow direction of a coolant in an electrostatic chuck assembly of FIG. 6A.

Referring to FIG. 6C, the first supply valve 211*s* and the first return valve 211*r* of the first valve box 210 may each be set to have the switch-off state and the second supply valve 212*s* and the second return valve 212*r* of the first valve box 210 may each be set to have the switch-on state. The first supply valve 221*s* and the first return valve 221*r* of the second valve box 220 may each be set to have the switch-off state and the second supply valve 222*s* and the second return valve 222*r* of the second valve box 220 may each be set to have the switch-on state. These states of the valves may enable the coolant to flow in the backward direction, i.e., the centripetal direction.

The coolant may flow into the first valve box 210 from the first chiller 230 through the first supply line 251*a*. The coolant, which is fed into the first valve box 210, may be introduced into the second opening 112*b* of the channel 112 through the first backward line 257*a* by the switch-on state of the second supply valve 212*s*.

The coolant may flow into the second valve box 220 from the second chiller 240 through the second supply line 251*b*. The coolant, which is fed into the second valve box 220, may be introduced into the second opening 112*b* of the channel 112 through the second backward line 257*b* by the switch-on state of the first supply valve 222*s*.

The coolant, which is introduced into the second opening 112*b* through the first backward line 257*a* and the second backward line 257*b*, may be drained from the first opening 112*a* after passing through the channel 112. The coolant, which is drained from the first opening 112*a*, may flow into the first forward line 255*a* and the second forward line 257*a*.

The coolant, which is fed into first the valve box 210 from the channel 112 through the first forward line 255*a*, may return into the first chiller 230 through the first return line 253*a* by the switch-on state of the second return valve 212*r*.

The coolant, which is fed into second the valve box 220 from the channel 112 through the second forward line 255b, may return into the second chiller 240 through the second return line 253b by the switch-on state of the second return valve 222r.

The backward flow direction of the coolant may be represented by a bold solid line. Dotted hatchings may be used to represent the switch-on states of the second supply valve 212s and the second return valve 212r of the first valve box 210 and the second supply valve 222s and the second return valve 222r of the second valve box 220.

As discussed with reference to FIGS. 6B and 6C, the substrate 90 may be cooled down using the bidirectional flow of the coolant by simultaneously operating the first valve box 210 and the second valve box 220. In an embodiment, the substrate 90 may be cooled down using the bidirectional flow of the coolant by operating the first valve box 210 and the first chiller 230. The second valve box 220 and the second chiller 240 may be in the operable state in the standby mode.

Figure 7:
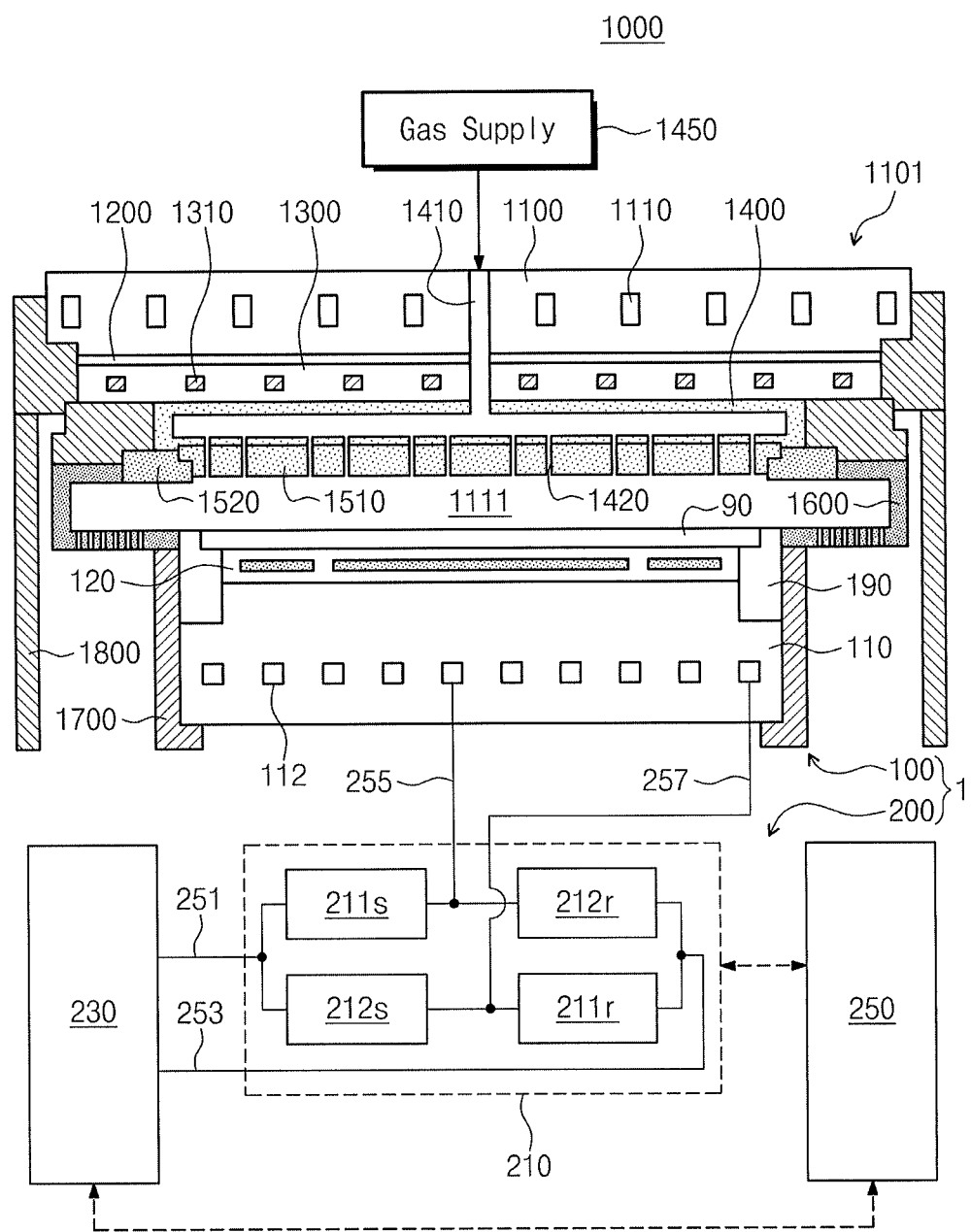
FIG. 7 illustrates a schematic view of a semiconductor fabricating apparatus having an electrostatic chuck assembly according to an exemplary embodiment.

FIG. 7 illustrates a schematic view of a semiconductor fabricating apparatus having an electrostatic chuck assembly according to an exemplary embodiment.

Referring to FIG. 7, a semiconductor fabricating apparatus 1000 may be an apparatus for carrying out a plasma treatment (e.g., a plasma etching) on the substrate 90 mounted on the electrostatic chuck assembly 100 using capacitively coupled plasma (CCP). The electrostatic chuck assembly 100 may also be used in an apparatus for carrying out a plasma treatment using inductively coupled plasma (ICP).

The semiconductor fabricating apparatus 1000 may include the electrostatic chuck assembly 1 which is arranged on a supporter 1700. The electrostatic chuck assembly 1 may include the electrostatic chuck 100 and the coolant circulating system 200, as illustrated in FIG. 1A. The electrostatic chuck 100 may act as a lower electrode.

The semiconductor fabricating apparatus 1000 may include the electrostatic chuck assembly 2 of FIG. 5A or the electrostatic chuck assembly 3 of FIG. 6A instead of the electrostatic chuck assembly 1. The detailed descriptions of the electrostatic chuck assemblies 1, 2 and 3 may be omitted for brevity.

The electrostatic chuck 100 may further include a focus ring 190 surrounding the substrate 90. The focus ring 190 may be provided to help enhance the uniformity of the plasma treatment such as a plasma etching. The focus ring 190 may include one or more of quartz, $Al_2O_3$, $Y_2O_3$, Si, SiC, or $SiO_2$.

The semiconductor fabricating apparatus 1000 may include the electrostatic chuck assembly 1, a showerhead electrode assembly 1101 positioned above the electrostatic chuck assembly 1, and a chamber wall 1800. A plasma confinement region 1111 may be defined between the electrostatic chuck assembly 1 and the showerhead electrode assembly 1. A processing gas (e.g., an etching gas) may be introduced into the plasma confinement region 1111 from a gas supply 1450, and the substrate 90 may have an experience of, e.g., may be exposed to, a plasma treatment.

The showerhead electrode assembly 1101 may include a cooling plate 1100, a thermal choke 1200, a heater plate 1300, a showerhead 1400, and an upper electrode 1510 and 1520 which are stacked one another. The upper electrode 1510 and 1520 may be thermally controlled by the cooling plate 1100 and the heater plate 1300.

The cooling plate 1100 may be made of metal such as Al and include a channel 1110 through which a cooling liquid is flowed. The thermal choke 1200 may be provided to control heat conduction between the heater plate 1300 and the cooling plate 1100. The thermal choke 1200 may be made of a material substantially identical or similar to those of the heater plate 1300 and/or the cooling plate 1100. The heater plate 1300 may be made of Al and include a heater electrode 1310 circularly or concentrically arranged therein.

The showerhead 1400 may be made of Al and include a gas passage 1410 distributing the processing gas to the plasma confinement region 1111. The upper electrode 1510 and 1520 may include a circular-shaped inner electrode 1510 and a loop-shaped outer electrode 1520 surrounding the inner electrode 1510. At least one of the inner and outer electrodes 1510 and 1520 may be made of Si or SiC. The gas passage 1410 may be connected to gas paths 1420 penetrating the inner electrode 1510.

The showerhead electrode assembly 1101 may further include a shroud 1600 connected to the electrostatic chuck 100 and the upper electrode 1510 and 1520 to define the plasma confinement region 1111.

A radio frequency (RF) may be applied to the electrostatic chuck 100 and/or the upper electrode 1510 and 1520, plasma may be created in the plasma confinement region 1111, and a plasma treatment may be performed to the substrate 90. The electrostatic chuck assembly 1 may enable the coolant to have the bidirectional flow, the temperature difference of the substrate 90 may be eliminated or reduced, and uniformity of the plasma treatment may be enhanced.

By way of summation and review, coolant may flow one-directionally in an electrostatic chuck to cool a wafer thereon. The temperature of an inlet, e.g., corresponding to an edge of the wafer, may be higher than that of an outlet, e.g., corresponding to a center of the wafer, the wafer may be unevenly cooled, and process non-uniformity may occur.

Embodiments may enable a flow direction of the coolant to be switched between forward and reverse directions without changing the structure of the electrostatic chuck, and the wafer may be cooled to achieve uniform temperature distribution.

According to embodiments, provided are electrostatic chuck assemblies and semiconductor fabricating apparatus in which coolant may bi-directionally flow in the channel of the electrostatic chuck, and uneven cooling of the substrate, for example, due to one-directional flow of the coolant, may be reduced or eliminated. The bidirectional flow of the coolant may help provide improve the temperature distribution of a substrate, e.g., may help provide a uniform temperature distribution of the substrate, and process uniformity, e.g., uniformity of a plasma treatment, may be enhanced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An electrostatic chuck assembly, comprising:
an electrostatic chuck on which a substrate is loaded;

a channel that provides a flow passage for coolant in the electrostatic chuck, the channel having a first opening at a first end corresponding to a center of the substrate and a second opening at a second end corresponding to an edge of the substrate; and a valve box to control a flow direction of the coolant in the channel, the valve box including:
- a first supply valve to control a supply of the coolant into the first opening;
- a first return valve to control a drainage of the coolant from the second opening;
- a second supply valve to control a supply of the coolant into the second opening; and
- a second return valve to control a drainage of the coolant from the first opening, wherein, when each of the first supply and return valves is set to be in an open state and each of the second supply and return valves is set to be in a closed state,
- the open state of the first supply valve allows the coolant to flow into the channel through the first opening, and
- the open state of the first return valve allows the coolant to discharge from the channel through the second opening.

2. The electrostatic chuck assembly as claimed in claim 1, wherein the coolant flows in a direction toward the edge of the substrate from the center of the substrate.

3. The electrostatic chuck assembly as claimed in claim 1, wherein, when each of the first supply and return valves is set to be in the closed state and each of the second supply and return valves is set to be in the open state,
- the open state of the second supply valve allows the coolant to flow into the channel through the second opening, and
- the open state of the second return valve allows the coolant to discharge from the channel through the first opening.

4. The electrostatic chuck assembly as claimed in claim 3, wherein the coolant flows in a direction toward the center of the substrate from the edge of the substrate.

5. The electrostatic chuck assembly as claimed in claim 1, wherein the channel spirally extends around the center of the substrate toward the edge of the substrate.

6. The electrostatic chuck assembly as claimed in claim 1, further comprising a chiller to transfer the coolant to the valve box.

7. The electrostatic chuck assembly as claimed in claim 6, further comprising a controller to control operations of the valve box and the chiller, the controller being electrically connected to the valve box and the chiller.

8. The electrostatic chuck assembly as claimed in claim 6, further comprising:
- a supply line to provide the coolant with a supply passage to the valve box from the chiller; and
- a return line to provide the coolant with a return passage to the chiller from the valve box.

9. The electrostatic chuck assembly as claimed in claim 8, wherein the supply line includes an end connected to the chiller and a branched-out end connected to the first supply valve and the second supply valve, and
the return line includes an end connected to the chiller and a branched-out end connected to the first return valve and the second return valve.

10. The electrostatic chuck assembly as claimed in claim 1, further comprising:
- a forward line to provide the coolant with a forward directional passage to the first opening from the valve box; and
- a backward line to provide the coolant with a backward directional passage to the second opening from the valve box,
- wherein the forward line includes an end connected to the first opening and a branched-out end connected to the first supply valve and the second return valve, and
- wherein the backward line includes an end connected to the second opening and a branched-out end connected to the second supply valve and the first return valve.

11. The electrostatic chuck assembly as claimed in claim 10, wherein, when each of the first supply and return valves is set to be in the open state and each of the second supply and return valves is set to be in the closed state,
- the open state of the first supply valve allows the coolant to flow into the channel through the forward line via the first opening, and
- the open state of the first return valve allows the coolant to discharge from the channel through the backward line via the second opening.

12. The electrostatic chuck assembly as claimed in claim 10, wherein, when each of the first supply and return valves is set to be in the closed state and each of the second supply and return valves is set to be in the open state,
- the open state of the second supply valve allows the coolant to flow into the channel through the backward line via the second opening, and
- the open state of the second return valve allows the coolant to discharge from the channel through the forward line via the first opening.

13. The electrostatic chuck assembly as claimed in claim 1, further comprising a second valve box to control the flow direction of the coolant in the channel, the second valve box including:
- a third supply valve to control a supply of the coolant into the first opening;
- a third return valve to control an drainage of the coolant from the second opening;
- a fourth supply valve to control a supply of the coolant into the second opening; and
- a fourth return valve to control an drainage of the coolant from the first opening.

14. The electrostatic chuck assembly as claimed in claim 13, wherein, when each of the third supply and return valves is set to be in the open state and each of the fourth supply and return valves is set to be in the closed state,
- the open state of the third supply valve allows the coolant to flow into the channel through the first opening, and
- the open state of the third return valve allows the coolant to discharge from the channel through the second opening.

15. The electrostatic chuck assembly as claimed in claim 13, wherein, when each of the third supply and return valves is set to be in the closed state and each of the fourth supply and return valves is set to be in the open state,
- the open state of the fourth supply valve allows the coolant to flow into the channel through the second opening, and
- the open state of the fourth return valve allows the coolant to discharge from the channel through the first opening.

16. The electrostatic chuck assembly as claimed in claim 13, further comprising a chiller to transfer the coolant to the valve box and the second valve box.

17. The electrostatic chuck assembly as claimed in claim 13, further comprising:
- a first chiller to transfer the coolant to the valve box; and
- a second chiller to transfer the coolant to the second valve box.

18. An electrostatic chuck assembly, comprising:
an electrostatic chuck on which a substrate is loaded;
a channel that provides a flow passage for coolant in the electrostatic chuck, the channel having a first opening at a first end corresponding to a center of the substrate and a second opening at a second end corresponding to an edge of the substrate, the channel spirally extending around the first opening toward the second opening; and
a valve box to control a flow direction of the coolant in the channel, the valve box including:
  a first valve group to provide the coolant with a centrifugal flow toward the second opening from the first opening; and
  a second valve group to provide the coolant with a centripetal flow toward the first opening from the second opening,
the centrifugal flow of the coolant being established by an open state of the first valve group and a closed state of the second valve group, and
the centripetal flow of the coolant being established by a closed state of the first valve group and an open state of the second valve group.

19. An electrostatic chuck assembly, comprising:
a base having a disk shape;
a channel in the base, the channel to provide a flow passage for fluid in the base, the channel having a first opening at a first end corresponding to a center of the base and a second opening at a second end corresponding to an edge of the base, the channel extending around the first opening toward the second opening;
a dielectric layer on the base, the dielectric layer including an insulator and having a disk shape whose diameter is smaller than that of a portion of the base;
an electrostatic electrode including a first electrode and a second electrode, the first and second electrodes being embedded in the dielectric layer and to receive different voltages, respectively;
a focus ring surrounding the dielectric layer; and
a controller to provide bidirectional flow of the fluid in the channel.

20. The electrostatic chuck assembly as claimed in claim 19, wherein the first and second electrodes receive different voltages from an electrical power, respectively.

* * * * *